United States Patent
Akiyama

(10) Patent No.: US 9,537,289 B1
(45) Date of Patent: Jan. 3, 2017

(54) MODULATED LIGHT SOURCE

(71) Applicants: FUJITSU LIMITED, Kawasaki-shi, Kanagawa (JP); Photonics Electronics Technology Research Association, Bunkyo-ku, Tokyo (JP)

(72) Inventor: Tomoyuki Akiyama, Yokohama (JP)

(73) Assignees: FUJITSU LIMITED, Kawasaki (JP); PHOTONICS ELECTRONICS TECHNOLOGY RESEARCH ASSOCIATION, Tokyo (JP)

( * ) Notice: Subject to any disclaimer, the term of this patent is extended or adjusted under 35 U.S.C. 154(b) by 0 days.

(21) Appl. No.: 15/146,215

(22) Filed: May 4, 2016

(30) Foreign Application Priority Data

Jun. 30, 2015 (JP) .................................. 2015-131771

(51) Int. Cl.
  *H01S 5/14* (2006.01)
  *H01S 5/125* (2006.01)
  *H01S 5/026* (2006.01)
  *H01S 5/0683* (2006.01)

(52) U.S. Cl.
  CPC ............ *H01S 5/142* (2013.01); *H01S 5/0261* (2013.01); *H01S 5/0265* (2013.01); *H01S 5/06832* (2013.01); *H01S 5/125* (2013.01)

(58) Field of Classification Search
  None
  See application file for complete search history.

(56) References Cited

U.S. PATENT DOCUMENTS

2009/0092159 A1   4/2009   Kato

FOREIGN PATENT DOCUMENTS

| JP | 2009-59729 A1 | 3/2009 |
| JP | 2011-75767 A1 | 4/2011 |
| JP | 2012-64862 A1 | 3/2012 |
| JP | 2014-211550 A1 | 11/2014 |

*Primary Examiner* — Armando Rodriguez
(74) *Attorney, Agent, or Firm* — Kratz, Quintos & Hanson, LLP

(57) ABSTRACT

A modulated light source includes a ring modulator, a first optical waveguide and a second optical waveguide that are optically connected to the ring modulator, and a third optical waveguide that optically connects an end of the first optical waveguide and an end of the second optical waveguide. At least part of the third optical waveguide has optical gain, and an optical waveguide loop including the ring modulator, the first optical waveguide, the second optical waveguide, and the third optical waveguide is used as a resonator to cause laser oscillation.

7 Claims, 10 Drawing Sheets

FIG. 4

|  | AMOUNT OF WAVELENGTH SHIFT | AMOUNT OF TEMPERATURE INCREASE |
| --- | --- | --- |
| RELATED ART | 19nm (FREE SPECTRAL RANGE) | 271°C |
| FIRST EMBODIMENT | 0.9nm (INTERVAL BETWEEN RING LASER MODES) | 13°C |

SIGNIFICANT IMPROVEMENT IN RELIABILITY DUE TO SIGNIFICANT DECREASE IN TEMPERATURE

MODULATED LIGHT SOURCE

CROSS-REFERENCE TO RELATED APPLICATION

This application is based upon and claims the benefit of priority of the prior Japanese Patent Application No. 2015-131771, filed on Jun. 30, 2015, the entire contents of which are incorporated herein by reference.

FIELD

The embodiments discussed herein relate to a modulated light source.

BACKGROUND

It has been desired to develop a modulated light source that is compact and consumes a low power. In such a modulated light source, using a minute ring modulator with a silicon sub-micron optical waveguide has been studied.

FIG. 8 is a diagrammatic view depicting a schematic configuration of a modulated light source of related art using a ring modulator.

The modulated light source includes a distributed feedback (DFB) laser 101, a ring modulator 102, a PD 103, a wavelength controller 104, and a heater 105.

The PD 103 senses power of light having passed through the ring modulator 102. The wavelength controller 104 outputs a signal that controls the wavelength of the ring resonance based on the optical power sensed with the PD 103. The heater 105 heats the ring modulator 102 in accordance with the control signal from the wavelength controller 104 to adjust the wavelength of the ring modulator to match the laser wavelength.

In the modulated light source, the DFB laser 101 outputs laser light in a continuous emission mode. The outputted laser light passes through an optical waveguide and then is guided to the ring modulator 102, which modulates the transmissivity at the laser light wavelength transmissivity.

The ring modulator 102 has a Lorentzian spectrum centered at a resonance wavelength. The ring modulator 102 changes the resonance wavelength in accordance with a change in a modulation signal between voltages $V_0$ and $V_1$. The transmissivity is thus modulated, whereby intensity-modulated output light is produced.

The resonance wavelength of the ring modulator 102 changes as a circumference optical path length of the ring modulator 102 changes due to a manufacturing error and/or a temperature change, resulting in a discrepancy between the resonance wavelength and the wavelength of the laser light being emitted. As depicted in FIG. 9, to compensate for the discrepancy, the heater 105 heats the ring modulator 102 to raise the temperature of it for adjustment of the resonance wavelength.

In this case, however, it is undesirably difficult not only to ensure reliability of the modulated light source but also to improve power efficiency in the modulation or the like (decrease in electric power necessary for heater and modulation operation). The reason for this is as follows.

The case where the ring modulator has a small radius as depicted in FIG. 10A will be considered. In this case, the volume of the ring modulator is small, whereby electric power consumed by the heater that is required to compensate for the wavelength shift resulting from variation in temperature is decreased. Furthermore, the small radius of the ring modulator reduces a capacitance that serves as a load on a drive circuit of the ring modulator, whereby the modulation power is deceased. On the other hand, because the difference between the laser and the ring modulator wavelength amounts up to the free spectral range (FSR), an increased FSR increases the amount of required wavelength compensation, resulting in an increase in the amount of increase in the temperature of the ring modulator and hence a decrease in reliability of the ring modulator.

The case where the ring modulator 102 has a large radius as depicted in FIG. 10B will be considered. In this case, the FSR is small, resulting in a decrease in the amount of wavelength compensation, which reduces the amount of increase in the temperature of the ring modulator, whereby reliability of the ring modulator is ensured. On the other hand, the volume of the ring modulator increases, resulting in increases in modulation power, and electric power consumed by the heater that is required to compensate for the wavelength shift due to variation in temperature.

Furthermore, a problem caused by use of the DFB laser 101 is not negligible. That is, DFB lasers without a phase shift in the diffraction grating for improvement of power efficiency reduces a yield thereof. Conversely, introduction of a phase shift for improvement in the yield lowers the power efficiency.

Patent Document 1: Japanese Laid-open Patent Publication No. 2012-64862

Patent Document 2: Japanese Laid-open Patent Publication No. 2009-59729

SUMMARY

An aspect of a modulated light source includes a ring modulator, a first optical waveguide and a second optical waveguide that are optically connected to the ring modulator, and a third optical waveguide that optically connects one end of the first optical waveguide and one end of the second optical waveguide, wherein at least part of the third optical waveguide has optical gain, and an optical waveguide loop including the ring modulator, the first optical waveguide, the second optical waveguide, and the third optical waveguide is used as a resonator to cause laser oscillation.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a table depicting the amount of wavelength shift and the amount of temperature increase required for wavelength matching between the laser and the ring modulator;

DESCRIPTION OF EMBODIMENTS

Preferable embodiments of a modulated light source will be described below in detail with reference to the drawings.

(First Embodiment)

Figure 1:
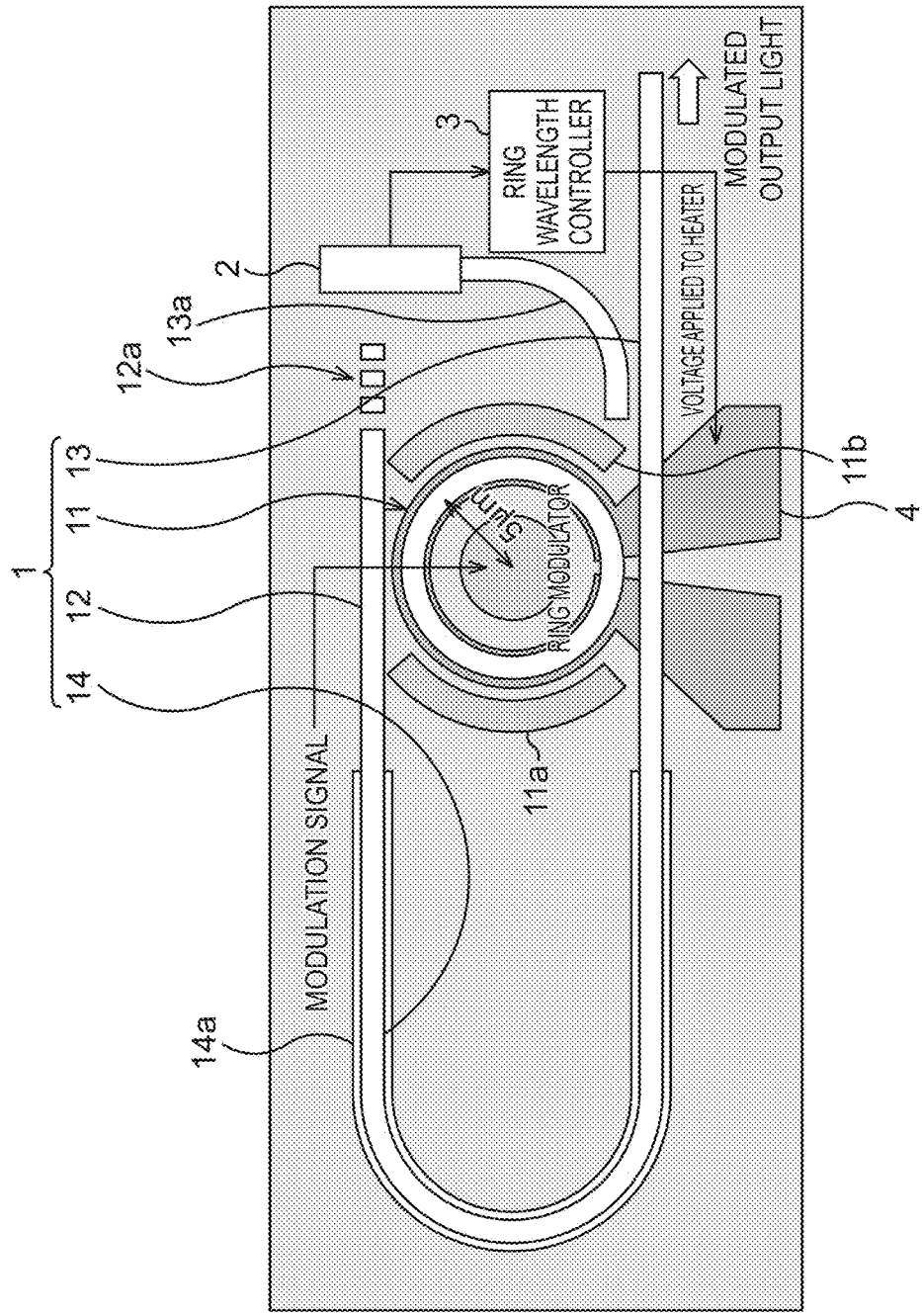
FIG. 1 is a diagrammatic view depicting a schematic configuration of a modulated light source according to a first embodiment.

FIG. 1 is a diagrammatic view depicting a schematic configuration of a modulated light source according to a first embodiment.

The modulated light source includes an optical waveguide loop 1, a photodiode (PD) 2, a wavelength controller 3, and a heater 4.

The optical waveguide loop 1 has a ring modulator 11, which is a band-pass filter, a first optical waveguide 12, a second optical waveguide 13, and a third optical waveguide 14. The first optical waveguide 12 and the second optical waveguide 13 are bus waveguides of the ring modulator 11. The third optical waveguide 14 is a U-shaped optical waveguide optically connecting a port on one end of the first optical waveguide 12 and a port on one end of the second optical waveguide 13, and at least a portion of the third optical waveguide 14 has optical gain. The optical waveguide loop 1 as a resonator causes laser oscillation.

The ring modulator 11 is a band-pass filter and is formed, for example, of a silicon wire. In the ring modulator 11, a P-type doped region and an N-type doped region are provided to form a PN junction (or PIN junction) in a ring-shaped optical waveguide formed of a silicon wire having a radius of, for example, about 5 μm. In the ring modulator 11, electrodes 11a and 11b and an electrode in a center part of the ring modulator 11 are disposed for modulating the resonance wavelength based on the modulation signal and in accordance with the intensity thereof. The electrodes 11a, 11b have the same polarity, and are conductive to each other. The electrode in the center part of the ring modulator 11 has different polarity from the electrodes 11a, 11b. These electrodes form a group of electrodes. The ring modulator 11 changes the refractive index of the optical waveguide to modulate the resonance wavelength by a reverse bias voltage or a forward bias voltage applied by the group of electrodes between the P-type doped region and the N-type doped region.

The first optical waveguide 12, the second optical waveguide 13, and the third optical waveguide 14 optically connected to the ring modulator 11 are formed of a silicon wire which is formed by processing, for example, an SOI layer of an SOI substrate. In the third optical waveguide 14, for example, GeSn is formed as an optical gain medium 14a in a region to which the optical gain is given. Among four ports of the first optical waveguide 12 and the second optical waveguide 13, which are bus waveguides of the ring modulator 11, for example, at a port on the other end of the first optical waveguide 12, a DBR mirror 12a having a reflectivity, for example, of 97% is formed of a diffraction grating.

In the port on the other end of the second optical waveguide 13, a tap 13a guiding part of output light is provided, and the PD 2 is disposed on the tap 13a.

The PD 2 senses the power of the light having been guided to an output port.

The wavelength controller 3 outputs a signal that controls the wavelength of the ring modulator based on the optical power sensed with the PD 2.

The heater 4 heats the ring modulator 11 in accordance with the signal from the wavelength controller 3 to adjust the ring resonance wavelength.

Figure 2:
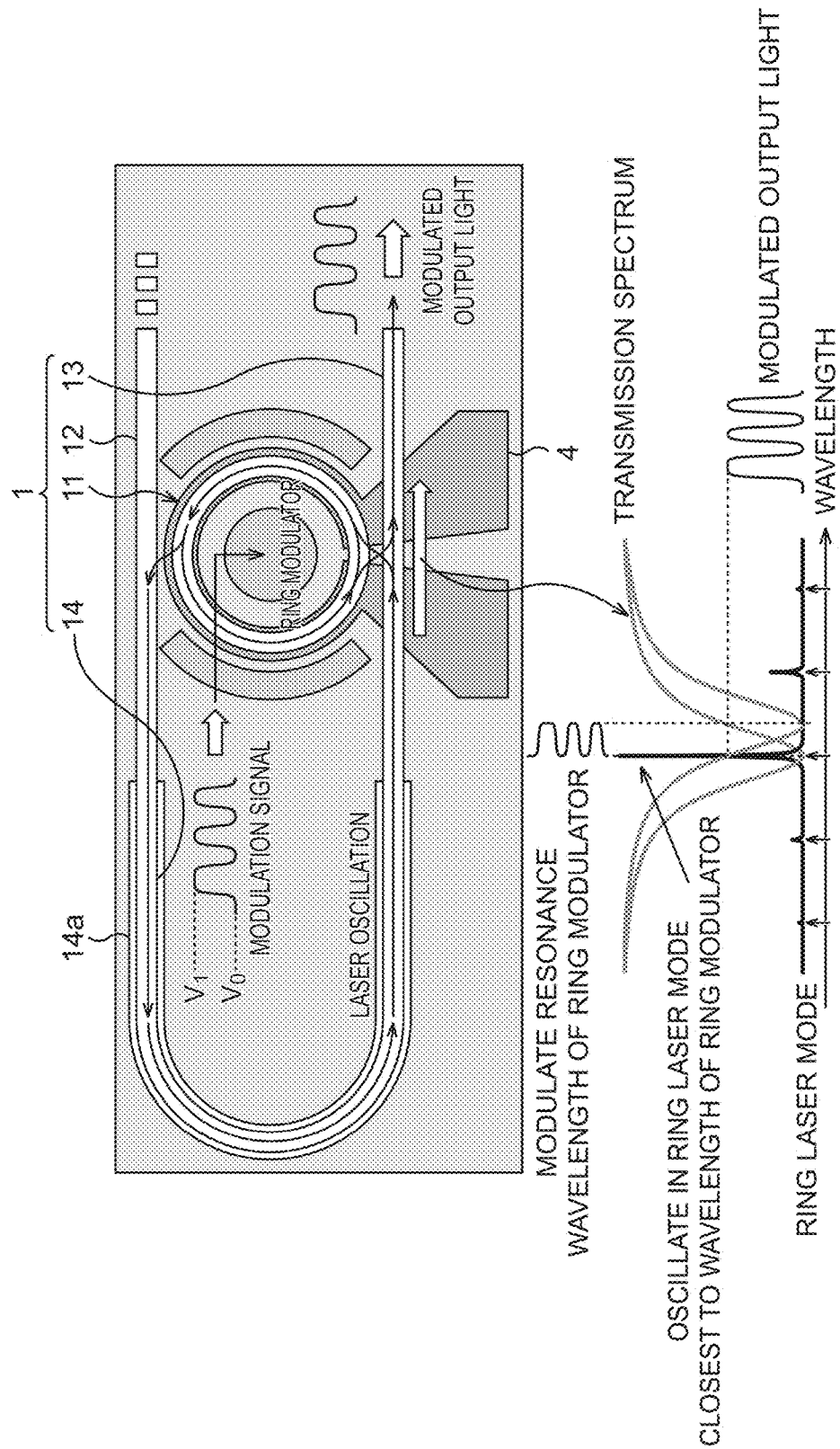
FIG. 2 is a diagrammatical view depicting in enlargement an optical waveguide loop of FIG. 1.

FIG. 2 is a diagrammatical view depicting in enlargement an optical waveguide loop of FIG. 1.

In the modulated light source according to the present embodiment, the optical waveguide loop 1 has optical bus waveguides (the first optical waveguide 12 and the second optical waveguide 13) of the ring modulator 11 optically connected to each other by the third optical waveguide 14, and the third optical waveguide 14 has optical gain. A ring laser resonator having the ring modulator 11 is thus formed. This ring laser resonator has optical gain, and a transmission wavelength band between the one end of the first optical waveguide 12 and the one end of the second optical waveguide 13 has a size that allows selecting one of a plurality of longitudinal modes in which laser oscillation is possible to occur. This enables the ring laser resonator to oscillate in a ring laser mode which is a single longitudinal mode existing within the transmission wavelength band of the transmission spectrum between the bus waveguides of the ring modulator 11. Adjusting the transmission wavelength band of the ring modulator 11 allows selectively oscillating in one predetermined ring laser mode.

Applying a digital modulation signal that changes between voltages $V_0$ and $V_1$ to the group of electrodes of the ring modulator 11 allows the resonance wavelength to be modulated in accordance with the intensity of the modulation signal. Transmissivity, $T_{out}$ to the output port at the wavelength of the emitted light can thus be modulated. The power $P_{out}$ of the output light is equal to the product $P_r P_{out}$ of the optical power $P_r$ in the optical resonator and the transmissivity $T_{out}$, and thus a design of the optical resonator with reduced variation in $P_r$ allows the power $P_{out}$ to be modulated in correspondence with the modulation signal.

Figure 3:
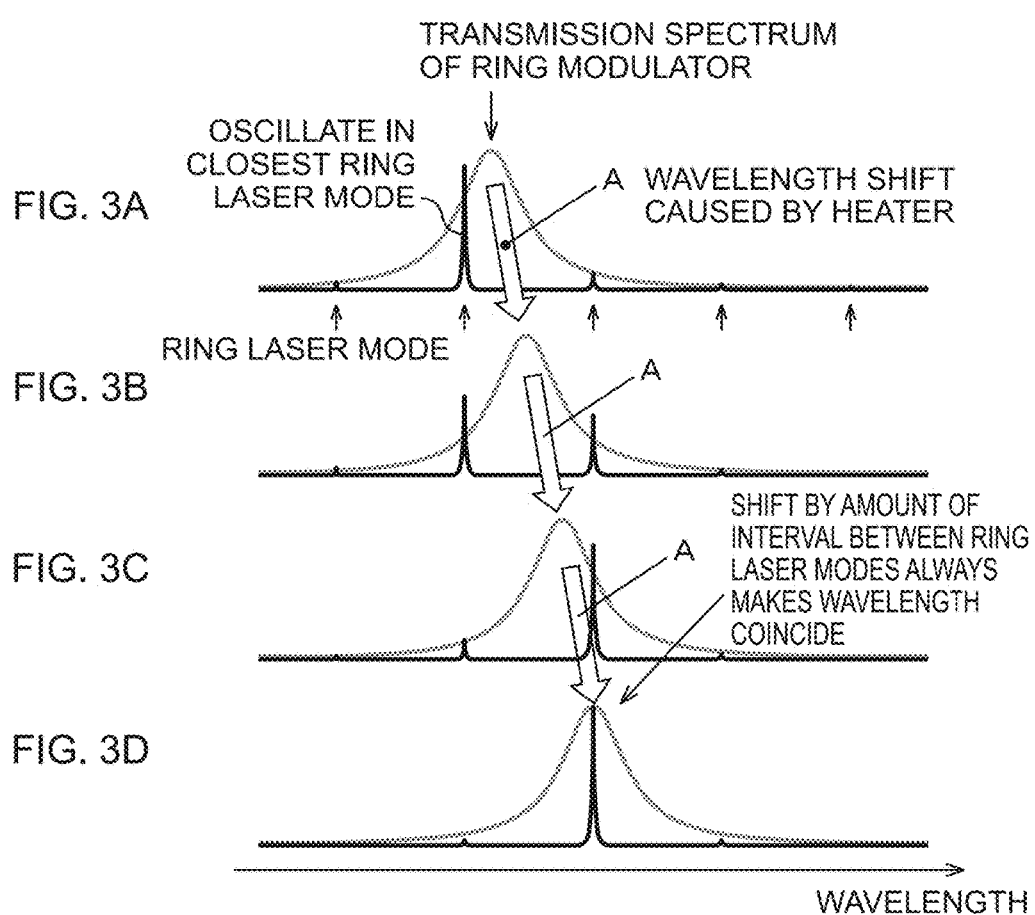
FIGS. 3A to 3D are diagrams depicting operation when a wavelength is adjusted in the optical device according to the present embodiment.

FIGS. 3A to 3D are diagrams depicting operation when a wavelength is adjusted in the modulated light source according to the present embodiment. FIG. 3A depicts a state before the wavelength is adjusted, and FIG. 3D depicts a state after the wavelength is adjusted.

As depicted with an arrow in FIG. 3A, there are ring laser modes at equal intervals that can be oscillated by the ring laser resonator having the optical gain medium. The interval between the ring laser modes is proportional to the reciprocal of a circumference optical path length of the ring laser resonator. The transmission peak of the ring modulator 11 does not necessarily coincide with the wavelength of the ring laser modes in the state before adjustment. At this time, one among the ring laser modes that is closest to the transmission peak of the ring modulator 11 is oscillated with priority.

Turning on the heater 4 causes the transmission peak of the ring modulator 11 to shift to the long wavelength side. Accompanying this, as depicted in FIGS. 3B and 3C, the ring laser mode closest to the transmission peak wavelength of the ring modulator 11 is switched to the next ring laser mode on the long wavelength side. At this time, as depicted in FIG. 3C, the ring laser mode to be oscillated is also switched. The timing of this switching is before the transmission peak wavelength of the ring modulator 11 reaches the ring laser mode on the long wavelength side, as depicted in FIG. 3C. Because of this, increasing the power of the heater 4 to adjust the transmission peak wavelength of the ring modulator 11 to the long wavelength side can make the transmission peak wavelength of the ring modulator 11 finally coincide with the ring laser mode, as depicted in FIG. 3D. When the laser oscillation wavelength and the transmission peak wavelength of the ring modulator 11 are made to coincide in this manner, the range of adjusting the transmission peak wavelength of the ring modulator 11 with the heater 4 can be reduced to be equal to or lower than the interval between the ring laser modes. As will be described later, in the related art, a free spectral range (FSR) is required at the maximum as the amount of adjustment of a wavelength shift of the ring modulator. In the present embodiment, the interval between the ring laser modes can be made much smaller than the FSR.

In the ring modulator using optical waveguides each formed of a silicon wire, the ring radius can be reduced to about 5 μm without a significant increase in the bending loss, and the electric power necessary for the modulation and the electric power consumed by the heater can be lowered as the ring radius decreases. In the case that the ring radius is 5 μm, the free spectral range (FSR) becomes about 19 nm. In this case, a wavelength shift of about 19 nm is required at the maximum in the related art. On the other hand, in the present embodiment, in which the circumference optical path length of the ring laser resonator is set at about 800 μm, the interval between the ring laser modes becomes about 0.8 nm. In this case, as depicted in FIG. 4, the amount of wavelength shift compensation is only 0.8 nm at the maximum. When the amount of wavelength shift compensation is converted into temperature by using a wavelength-temperature coefficient of 0.07 nm/K, it is necessary to increase the temperature by approximately 271° C. in related art. In contrast, in the present embodiment, an increase in temperature is only 11.4° C., resulting in a significant improvement in reliability. The power consumed by the heater can also be reduced to about 0.8 nm / 19 nm×100≈4.2%.

Figure 5:
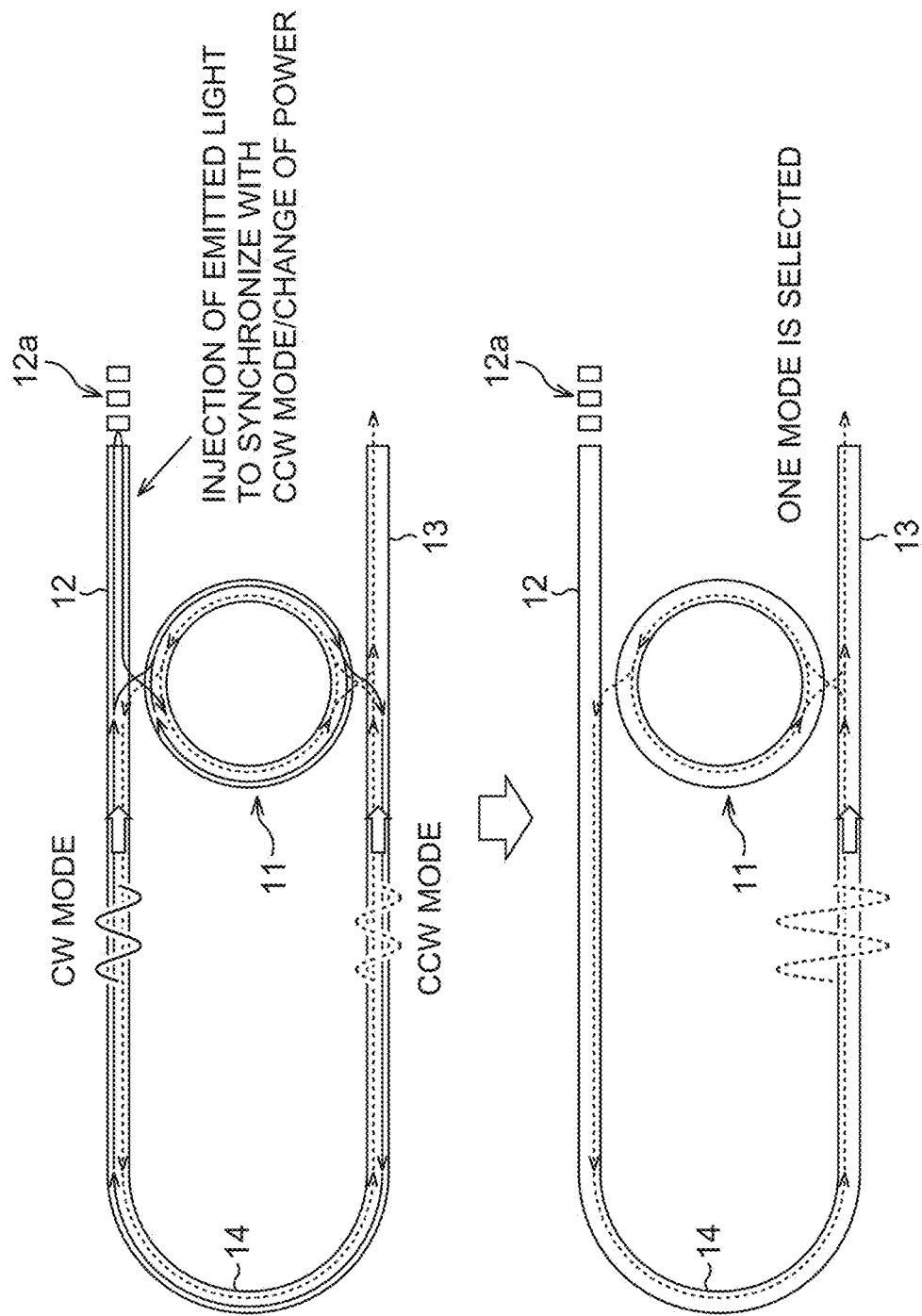
FIGS. 5A and 5B are diagrammatic views describing a mechanism for selecting an oscillation mode in a ring laser resonator.

The ring laser resonator has two types of oscillation modes, a clockwise (CW) mode and a counterclockwise (CCW) mode. Although the modulation operation is possible even when the CW mode and the CCW mode are oscillated simultaneously, the output light is dispersed to two ports, and thus it is preferred to oscillate in one of the CW mode and the CCW mode. In order to cause oscillation in one mode, as depicted in FIG. 5A, the DBR mirror 12a is provided on the port on the other end of the first optical waveguide 12. The DBR mirror 12a can change part of the emitted light in the CW mode to the CCW mode. The phase of oscillation in the CCW mode is synchronous with the phase of the CW mode by injecting the emitted light in the CW mode. As a result, when the light changes from the CW mode to the CCW mode, a change with a phase satisfying predetermined interference conditions is always achieved. Consequently, as illustrated in FIG. 5B, the power of the emitted light in the CCW mode becomes higher than the power of the emitted light in the CW mode, and the oscillation in the CW mode finally stops.

In the present embodiment, by setting the circumference optical path length of the ring laser resonator to about 800 μm for example, the interval between the ring laser modes becomes 100 GHz (=0.8 nm). In this case, when the full width at the half maximum (FWHM) of the ring modulator 11 is set at 50 GHz for example, only one of the ring laser modes can be selectively oscillated, and moreover, the ring modulator 11 can provide a modulation band up to about 50 GHz.

In the present embodiment, a DBR mirror formed of a diffraction grating is exemplified as the light reflector provided in one port of the bus waveguides of the ring modulator 11, but the light reflector is not limited to a DBR mirror. The light reflector may be any component having reflectivity over a wavelength range wide enough to tolerate variation in the resonance wavelength of the ring modulator 11. For example, the light reflector may instead be a loop mirror, a mirror using an optical waveguide end surface, or a mirror using an optical waveguide end surface on which a metal film or a dielectric multilayer film is formed for enhanced reflectivity.

Further, a heater 4 is exemplified as part of the wavelength adjustment mechanism of the ring modulator 11, but the wavelength adjustment mechanism does not necessarily include a heater, and methods of applying current to the forward direction through a PN or PIN junction may be employed. In this case, the ring modulator has two portions. One of the portions is used as an intensity modulation region including a pair of first electrodes that modulates the resonance wavelength based on a modulation signal and in accordance with the intensity thereof. The other portion is used as a wavelength adjustment region including a pair of second electrodes to which a wavelength modulation control signal is inputted.

Further, GeSn is used as the optical gain medium 14a provided in the third optical waveguide 14, but the optical gain medium is not necessarily be GeSn. For example, another type of an optical gain medium using Ge may be used, or a III-V semiconductor or the like mounted on a silicon optical waveguide by wafer bonding or using an adhesive may be used. A gain chip formed of a III-V semiconductor that is flip-chip bonded to an end of a silicon optical waveguide may also be used.

In the present embodiment, power consumption required for correcting variation in wavelength of the ring modulator 11 can be suppressed largely. Further, increase in temperature when the wavelength adjustment is carried out with the heater 4 can be suppressed largely. In the present embodiment, a ring modulator with a small radius can be used. In the related art, when this ring modulator with a small radius is used, a temperature increase of, for example, 271° C. is required, which significantly exceeds the temperature for assuring reliability in the silicon process (about 140° C.). On the other hand, in the present embodiment, a temperature increase of only about 11.4° C. is required for the ring modulator with a small radius. Therefore, electric power necessary for the modulation and electric power necessary for heating by the heater can be decreased while the reliability is ensured.

According to the aspects described above, an excellent, minute multi-wavelength modulated light source meets the two requirements at the same time, one of which is to ensure the reliability of the modulated light source and the other of which is to improve power efficiency in modulation operation and/or the like.

(Second Embodiment)

In the second embodiment, a modulated light source is disclosed as in the first embodiment, but the disclosed modulated light source differs from the modulated light source according to the first embodiment in that it is a multi-wavelength modulated light source.

Figure 6:
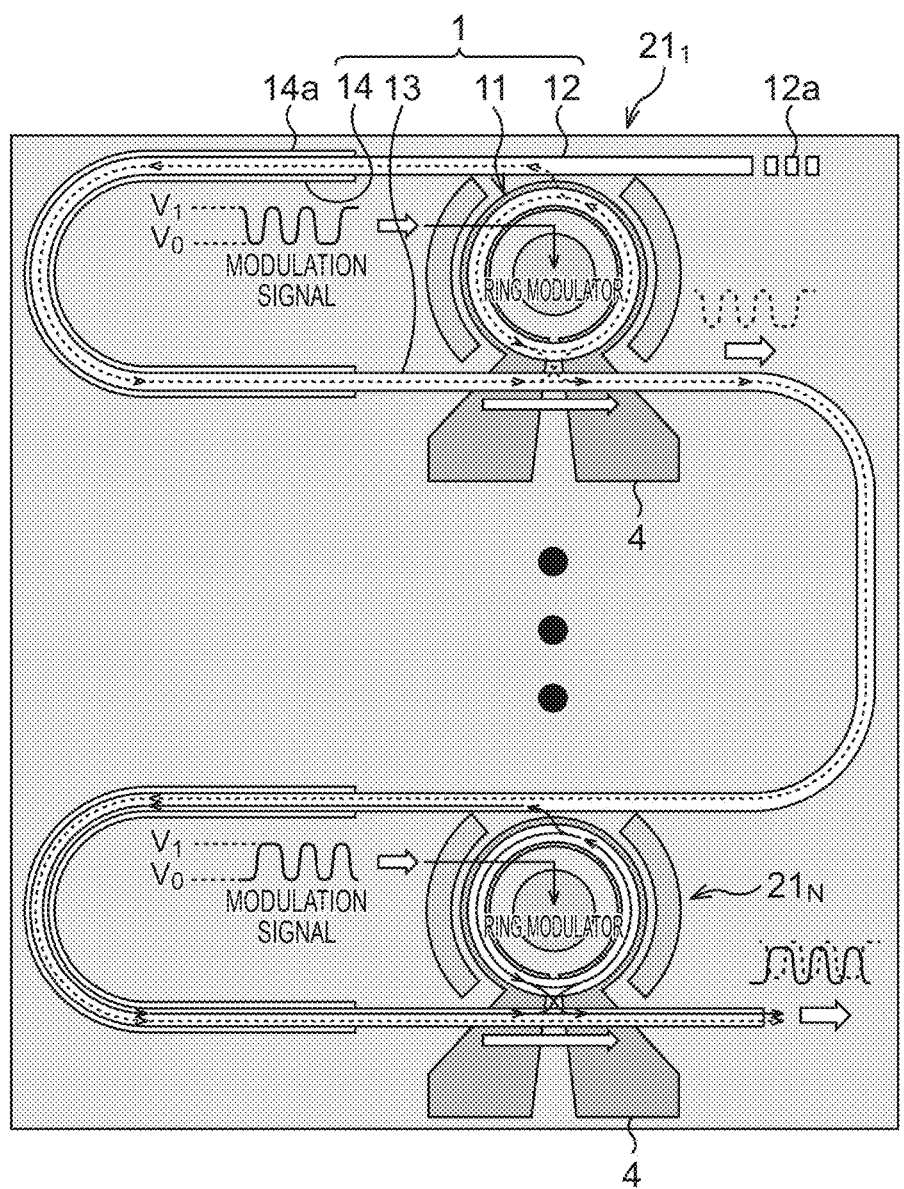
FIG. 6 is a diagrammatic view depicting a schematic configuration of a modulated light source according to a second embodiment.

FIG. 6 is a diagrammatic view depicting a schematic configuration of the modulated light source according to the second embodiment. The constituent members and other components corresponding to those in the first embodiment have the same reference characters as those in FIG. 1 and will not be described in detail.

The modulated light source includes a plurality of light modulation units $21_1$ to $21_N$ (N≥2).

Each light modulation unit includes an optical waveguide loop 1, a photodiode (PD) 2, a wavelength controller 3, and a heater 4, similarly to the first embodiment in FIG. 1. In FIG. 6, the PD 4 and the wavelength controller 3 are omitted. The optical waveguide loop 1 has a ring modulator 11, a first optical waveguide 12, a second optical waveguide 13, and a third optical waveguide 14, similarly to the first embodiment in FIG. 1. In a light modulation unit $21_k$ (1≤k≤N) and a light modulation unit $21_{k+1}$ which are adjacent to each other, the port on the other end of the second optical waveguide 13 of the light modulation unit $21_k$ and the port on one end of the first optical waveguide 12 of the light modulation unit $21_{k+1}$ are connected directly to each other. A DBR mirror 12a is formed at the other end of the first optical waveguide 12 of the light modulation unit $21_1$ and this other end is not connected directly to any other port, and the other end of the second optical waveguide 13 of the light modulation unit $21_N$ is not connected directly to any other port and serves as a light output port.

The emitted light outputted through the plurality of optical waveguide loops 1, which are ring laser resonators, is guided to one light output port. By changing the resonance wavelength of each ring modulator 11, the oscillation wavelength of the laser can be changed. A multi-wavelength modulated light source capable of combining lights can thus be achieved.

As described above, according to the aspects described above, an excellent, minute multi-wavelength modulated light source meets the two requirements at the same time, one of which is to ensure the reliability of the modulated light source and the other of which is to improve power efficiency in modulation operation and/or the like.

(Third Embodiment)

In the third embodiment, a modulated light source is disclosed as in the first embodiment, but the disclosed modulated light source differs from the modulated light source according to the first embodiment in that it is a multi-wavelength modulated light source.

Figure 7:
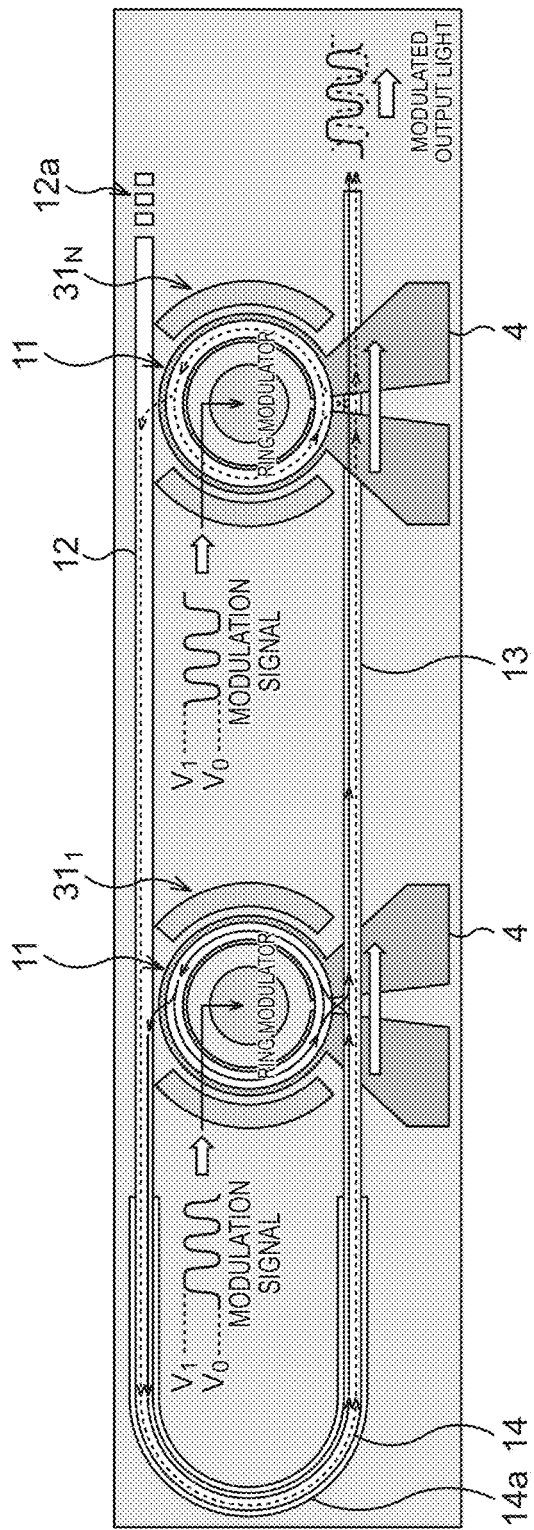
FIG. 7 is a diagrammatic view depicting a schematic configuration of a modulated light source according to a third embodiment.
Figure 8:
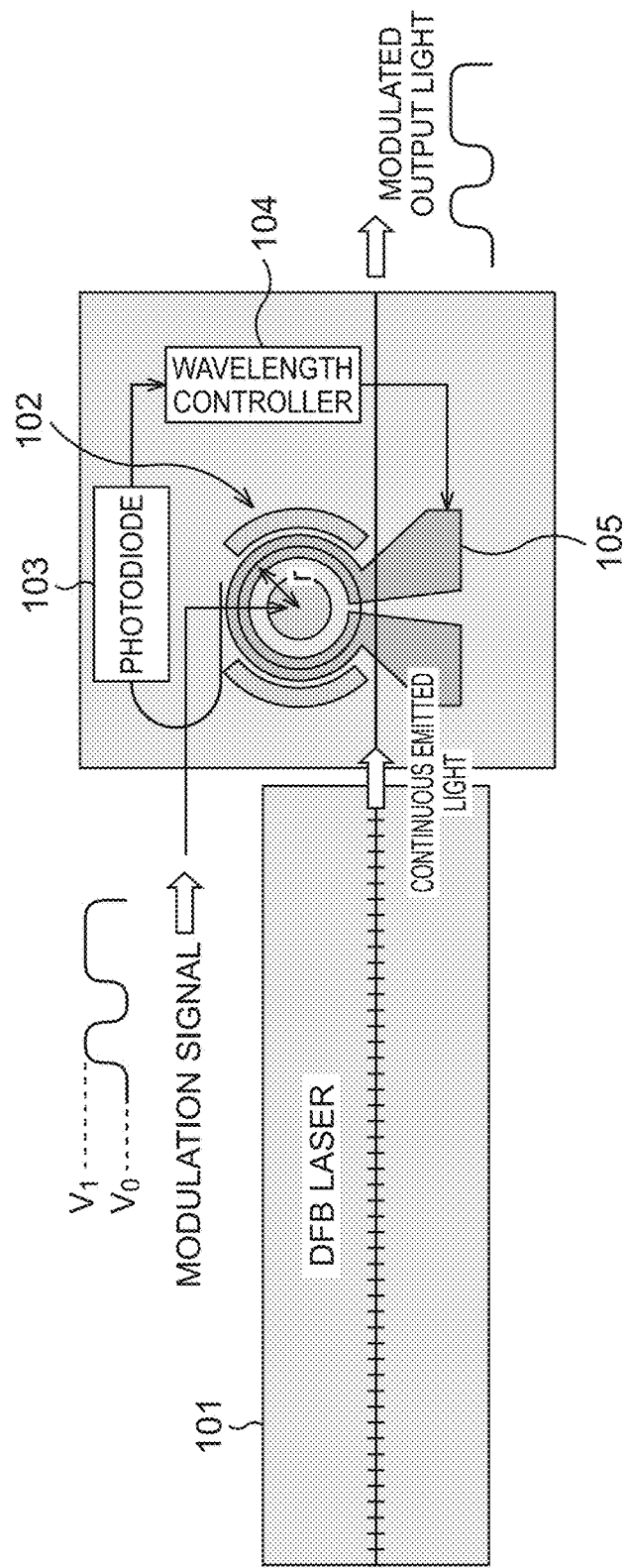
FIG. 8 is a diagrammatic view depicting a schematic configuration of a modulated light source of related art using a ring modulator.
Figure 9:
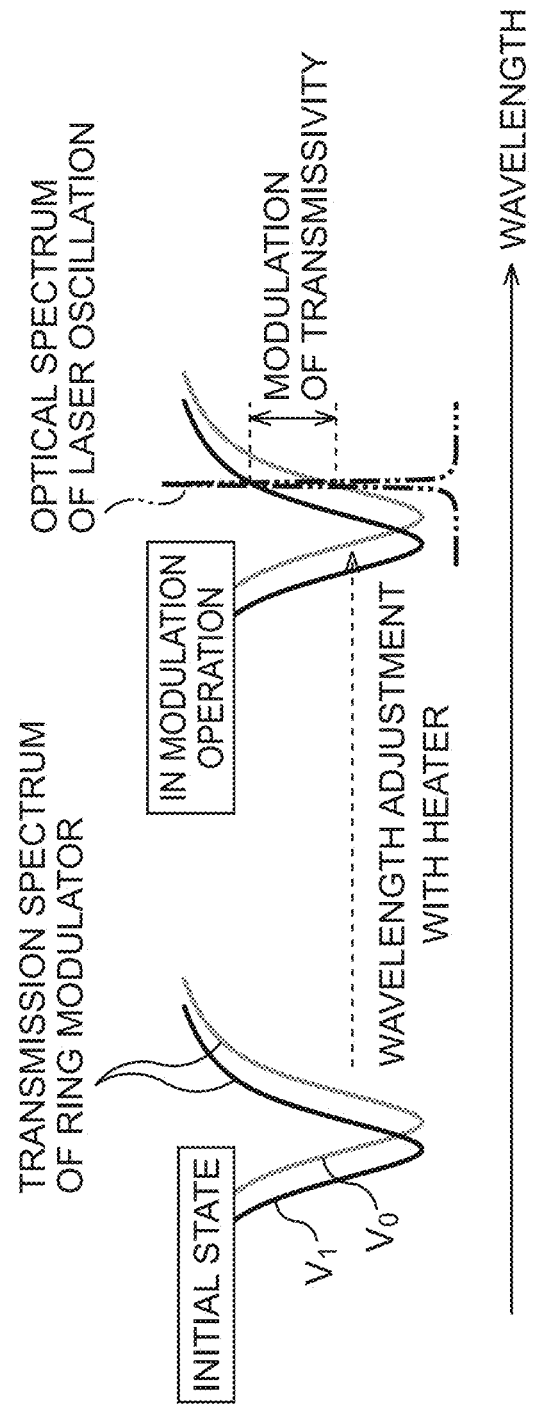
FIG. 9 is a diagram depicting how the modulated light source of related art adjusts the resonance wavelength.
Figure 10A:
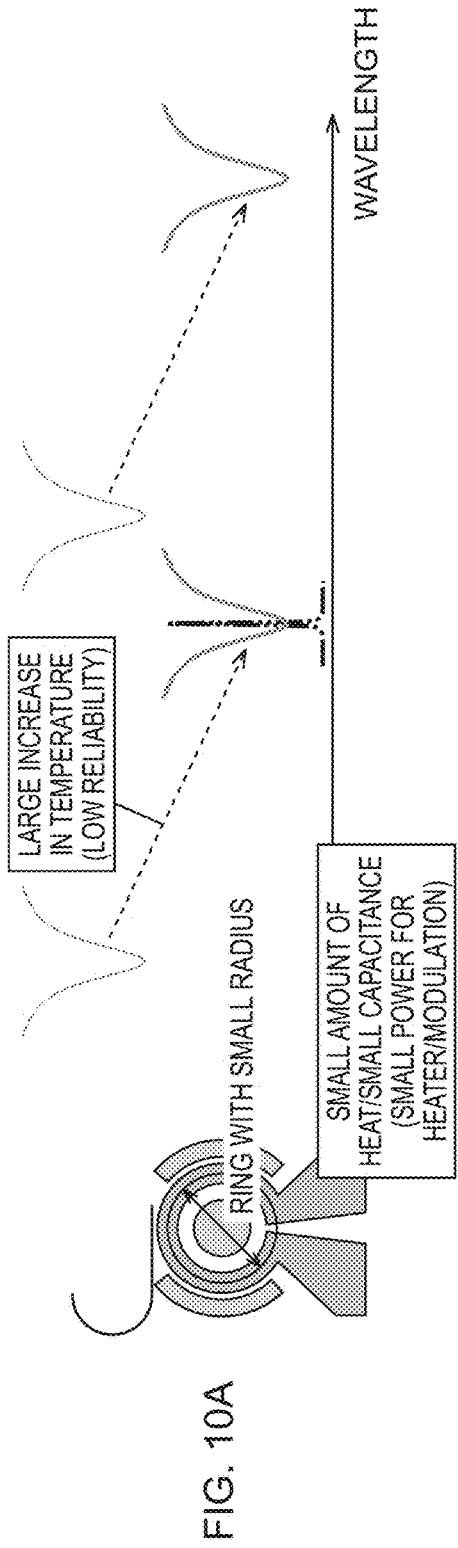
FIGS. 10A and 10B are diagrammatic views describing problems in the modulated light source of related art.
Figure 10B:
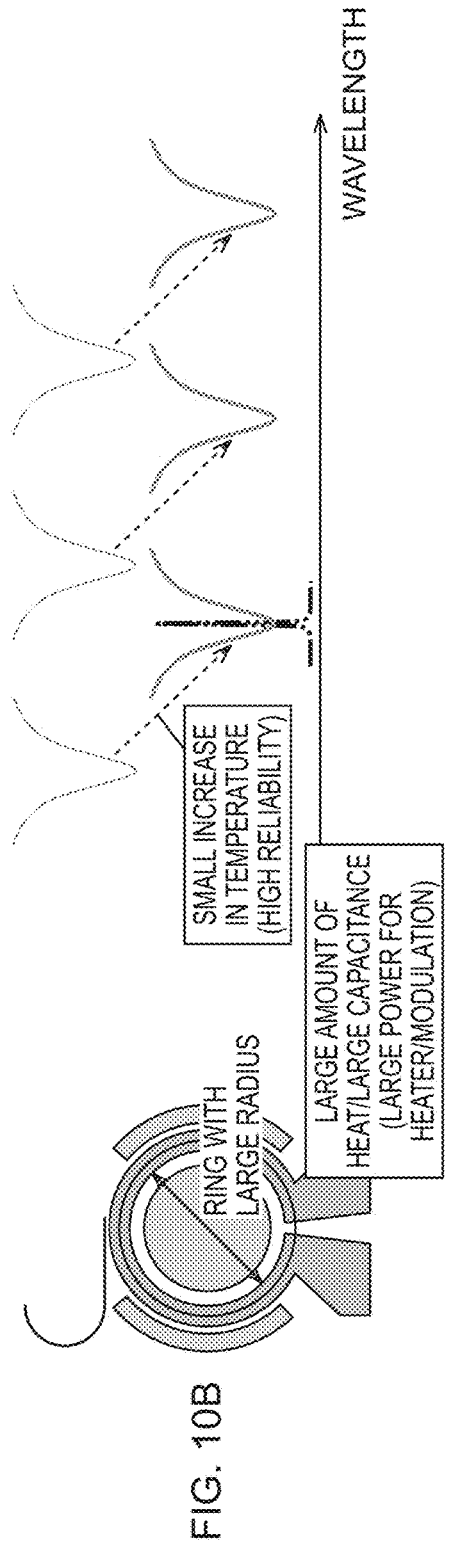

FIG. 7 depicts a configuration of the modulated light source according to the third embodiment. The constituent members and other components corresponding to those in the first embodiment have the same reference characters as those in FIG. 1 and will not be described in detail.

The modulated light source includes a plurality of light modulation units $31_1$ to $31_N$ (N≥2).

Each light modulation unit includes a ring modulator 11, a photodiode (PD) 2, a wavelength controller 3, and a heater 4. In FIG. 7, the PD 2 and the wavelength controller 3 are omitted. A first optical waveguide 12, a second optical waveguide 13, and a third optical waveguide 14 are provided in common for the light modulation units $31_1$ to $31_N$, so as to form an optical waveguide loop having a plurality of ring modulators 11, the first optical waveguide 12, the second optical waveguide 13, and the third optical waveguide 14.

In the present embodiment, a multi-wavelength modulated light source can guide emitted lights of a plurality of wavelengths to one output port and is capable of combining lights, similarly to the second embodiment. By sharing one optical gain medium 14a among the plurality of ring laser resonators each having the ring modulator 11, the number of optical gain media is decreased, reducing a load imposed on the manufacturing process thereof.

According to the aspects described above, an excellent, minute multi-wavelength modulated light source meets the two requirements at the same time, one of which is to ensure the reliability of the modulated light source and the other of which is to improve power efficiency in modulation operation and/or the like.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A modulated light source comprising:
    a ring modulator;
    a first optical waveguide and a second optical waveguide that are optically connected to the ring modulator; and
    a third optical waveguide that optically connects an end of the first optical waveguide and an end of the second optical waveguide,
    wherein at least part of the third optical waveguide has optical gain, and
    an optical waveguide loop including the ring modulator, the first optical waveguide, the second optical waveguide, and the third optical waveguide is used as a resonator to cause laser oscillation.

2. The modulated light source according to claim 1, wherein a transmission wavelength band between the end of the first optical waveguide and the end of the second optical waveguide has a size that allows selecting one of a plurality of longitudinal modes in which laser oscillation is possible to occur, and the laser oscillation occurs in a single longitudinal mode.

3. The modulated light source according to claim 1, wherein the first optical waveguide has another end having a mirror, and
    the second optical waveguide has another end serving as a light output port.

4. The modulated light source according to claim 1, including a plurality of optical waveguide loops each identical to the optical waveguide loop,
    wherein in two adjacent optical waveguide loops out of the optical waveguide loops, another end of the second optical waveguide of one of the two adjacent optical waveguide loops and an end of the first optical waveguide of the other of the two adjacent optical waveguide loops are connected directly to each other.

5. The modulated light source according to claim 4, wherein the first optical waveguide has another end having a mirror and not being connected directly to any end of another optical waveguide, and
    the second optical waveguide has another end serving as a light output port and not being connected directly to any end of another optical waveguide.

6. The modulated light source according to claim 1, wherein the optical waveguide loop has a plurality of ring modulators each identical to the ring modulator, and the first optical waveguide and the second optical waveguide are optically connected to the plurality of ring modulators.

7. The modulated light source according to claim 1, further comprising a heater unit that heats the ring modulator.

* * * * *